United States Patent
Pham

(10) Patent No.: US 7,362,155 B2
(45) Date of Patent: Apr. 22, 2008

(54) METHOD AND APPARATUS FOR GENERATING DELAYS

(75) Inventor: Chi M. Pham, Lawndale, CA (US)

(73) Assignee: Xerox Corporation, Norwalk, CT (US)

( * ) Notice: Subject to any disclaimer, the term of this patent is extended or adjusted under 35 U.S.C. 154(b) by 54 days.

(21) Appl. No.: 11/319,537

(22) Filed: Dec. 29, 2005

(65) Prior Publication Data

US 2007/0152725 A1 Jul. 5, 2007

(51) Int. Cl.
*H03H 11/26* (2006.01)
(52) U.S. Cl. ............... 327/232; 327/276; 327/277; 327/285
(58) Field of Classification Search ............... 327/231, 327/232, 276–278, 284, 285
See application file for complete search history.

(56) References Cited

U.S. PATENT DOCUMENTS 4,745,302 A * 5/1988 Hanawa et al. ............ 327/160
5,227,682 A * 7/1993 Nakabayashi et al. ...... 327/396

* cited by examiner

*Primary Examiner*—Kenneth B. Wells
(74) *Attorney, Agent, or Firm*—MH2 Technology Law Group LLP

(57) ABSTRACT

One embodiment pertains generally to a method of delaying based on a single clock signal. The method includes providing a first clock signal and generating a second clock signal based on the first clock signal and a third clock signal that is the inverse of the second clock signal. The method also includes generating a unit of delay based the first clock single and generating a half unit of delay based on the first and second clock signal.

16 Claims, 6 Drawing Sheets

METHOD AND APPARATUS FOR GENERATING DELAYS

FIELD

This invention generally relates to delays in an integrated circuit. More particularly, the invention relates to a method and apparatus for generating delays in an integrated circuit.

DESCRIPTION OF THE RELATED ART

Xerographic exposure systems are important for printing. In xerographic printing, lasers or LEDS may be used to expose tiny dots on a photoreceptor surface. The photoreceptor has the property of holding an electrical charge in the absence of light. Illumination of a spot on the photoreceptor by a laser or LED causes the loss of charge at the exposed spot. In a typical xerographic system, charge left on the photoreceptor attracts toner that is then transferred to paper which has a greater charge than the photoreceptor.

The lasers used in some printing systems are vertical cavity surface emitting laser ("VCSEL"). VCSEL is a type of semiconductor laser that emits the laser perpendicular to the chip surface. Some printing systems may contain an array of VCSELs arranged in a parallelogram configuration. Since the VCSELS are slightly askew, there exists an arbitrary pixel offset that must be corrected electronically to ensure proper alignment of pixels on a photoreceptor belt.

The correction for the offset is a relatively simple idea, i.e., each pixel (VCSEL cell) needs to be precisely delayed until the pixel is perpendicular to a reference pixel position. FIG. 8 illustrates an example of pixel offset caused by a VCSEL laser configuration.

As shown in FIG. 8, VCSEL array 805 may contain 32 VCSELs 810 arranged in a parallelogram configuration. For a matter of convenience, VCSELs 810 may be indexed in the horizontal direction by the numerical index and indexed in the vertical direction alphabetically. For example, the first VCSEL 810 may be referred to as A1, which is also the reference pixel.

As the VCSEL array 805 moves through the scan direction, there is an incremental delay between A1 and A2; A1 and A3; and so forth. The delay for row B of the VCSEL array 805, the incremental delay increases because of the delay between the rows and the delay between the columns.

Conventional systems typically used combinatorial circuits to program the delay between the reference pixel and another pixel in the array. However, this solution has drawbacks and disadvantages. For example, the combinatorial circuits may take a large area of real estate on the chip. Another drawback is that amount of additional design time to calculate and lay out the combinatorial circuits. Accordingly, there is a need in the art for a system and/or method to generate the delays quickly and without taking up large areas of silicon die.

SUMMARY

One embodiment pertains generally to a method of delaying based on a single clock signal. The method includes providing a first clock signal and generating a second clock signal based on the first clock signal and a third clock signal that is the inverse of the second clock signal. The method also includes generating a unit of delay based the first clock single and generating a half unit of delay based on the first and second clock signal.

Another embodiment relates generally to an apparatus for generating pixel delays. The apparatus includes an oscillator circuit configured to generate a first clock signal and a clock domain generator circuit configured to receive the first clock signal and generate a second clock signal and a third clock signal. The second clock signal is a multiple of the first clock signal and the third clock signal is the inverse of the second clock signal. The apparatus also includes a whole delay circuit, a half delay circuit, and a quarter delay circuit. The whole delay circuit configured to generate units of delay, where the whole delay circuit is configured to interface with the first clock signal. The half delay circuit configured to generate half-units of delay, where the half-delay circuit is configured to interface with the first clock signal and the second clock signal. The quarter delay circuit configured to generate half-units of delay, where the quarter delay circuit is configured to interface with the second clock signal and the third clock signal.

BRIEF DESCRIPTION OF THE DRAWINGS

Various features of the embodiments can be more fully appreciated as the same become better understood with reference to the following detailed description of the embodiments when considered in connection with the accompanying figures, in which.

DETAILED DESCRIPTION OF EMBODIMENTS

Figure 1:
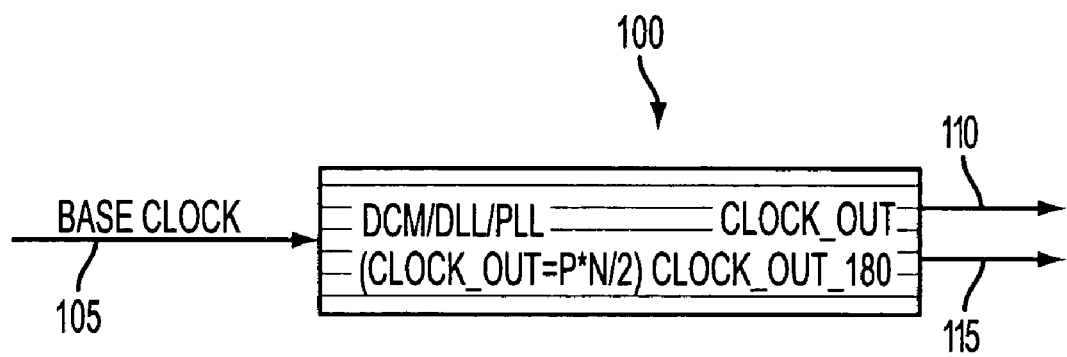
FIG. 1 illustrates an exemplary diagram of a clock domain generator in accordance with an embodiment.

For simplicity and illustrative purposes, the principles of the present invention are described by referring mainly to exemplary embodiments thereof. However, one of ordinary skill in the art would readily recognize that the same principles are equally applicable to, and can be implemented in, all types of circuits, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Embodiments generally relate to a method of manipulating clock signal on an integrated circuit to correct for pixel offsets. More particularly, a pixel delay clock ("PDC") circuit may be configured to delay the execution of each laser ("a pixel") in an array of vertical cavity surface emitting lasers ("VCSEL") until the pixel is aligned with the reference pixel. In some embodiments, the PDC circuit may also be configured to provide a delay up to a 0.125 pixel delay resolution.

In some embodiments, the PDC circuit may include a clock domain generator circuit, a whole-pixel delay circuit, a half-pixel delay circuit and a quarter-pixel delay circuit. The clock domain generator circuit may include a DCM/DLL or PLL circuit driven by a base clock, where the clock out signal (clock_out) may be generated based on base clock period (P) multiplied by an accuracy figure, N, i.e., clock out signal may be defined as (P*N/2). For example, a base clock signal of 100 MHz may yield a clock out signal of 200 MHz. An inverted clock out signal (clock_out_180) may be the inverted version of the clock out signal. Accordingly, the clock domain generator circuit may provide three clock domains: a base clock signal, a clock out signal, and an inverted clock out signal.

The whole pixel delay circuit may include a counter that is clocked with a base clock. The input to the counter may be the base clock signal (P). The output of the counter may be the pixel output enable signal (Pixel_Enable). The counter may be configured to set high or active the pixel output enable signal according to X*P, where X is the number of whole pixel delays.

The half pixel delay circuit may include two flip flops, e.g., D flip-flop. A first flip-flop may have a pixel enable signal connected to the input and the base clock signal as input clock signal. The output of the first flip-flop may be connected to the input of the second flip-flop. The output of the second flip flop may be the pixel enable half pixel delay signal (Pixel_Enable_h). The clock out signal from the clock domain generator circuit may be connected to the input clock of the second flip-flop. Since the clock out signal is twice the frequency of the base clock signal, the pixel enable half pixel delay signal are always at the half-clock boundary, which also corresponds to the half-pixel boundary.

The quarter pixel delay circuit may include two flip-flops, e.g., D flip flop. The first flip-flop may have the pixel enable from the whole delay circuit connected to the input. The clock out signal from the clock generator circuit may be connected to the clock input of the first flip flop. The output of the first flip may be connected to the input of the second flip-flop. The clock input of the second flip-flop may be connected with the clock out inverted signal of the clock generator circuit. The output of the second flip-flop may be the pixel enable quarter delay signal (Pixel_Enable_q). Since the clock out signal is twice the frequency of the pixel clock and clock out inverted is the negative edge version of the clock out signal, there is always a 0.25 pixel separation between the flip-flops that are clocked between the clock out sign and inverted clock out signal.

FIG. 1 illustrates a diagram of a clock domain generator circuit 100 in accordance with an embodiment of the invention. It should be readily apparent to those of ordinary skill in the art that the circuit 100 depicted in FIG. 1 represents a generalized schematic illustration and that other components may be added or existing components may be removed or modified. Moreover, the components may be implemented in hardware, software or combinations thereof.

As shown in FIG. 1, the clock domain generator circuit 100 may be configured to generate multiple clock domains. More particular, the clock domain generator circuit 100 may generate a multiple of the input base clock 105 as the clock out signal (clock_out) 110. The clock domain generator circuit 100 may also be configured to generate an inverted clock out signal (clock_out_180) 115. The inverted clock out signal 115 may be the inverse of the clock out signal 105. Accordingly, three clock domains are available to generate delays: the base clock 105, the clock out signal 110, and the inverted clock out signal 115.

In some embodiments, the clock domain generator circuit 100 may be configured to generate the clock out signal 105 according to P*N/2, where P may be the pixel clock rate and N may be the resolution. For example, if N were determined to be 4, the resolution of the delay would be within 0.25 units of delay, i.e. 1/N.

The clock domain generator circuit 100 may be implemented using a digital clock manager, a delayed-lock loop or a phased-lock loop. These components are well known to those skilled in the art. The base clock 105 may be generated from an oscillator circuit (not shown), which may be part of another integrated circuit. Alternatively, an oscillator with the P clock rate may be used as the base clock.

Figure 2:
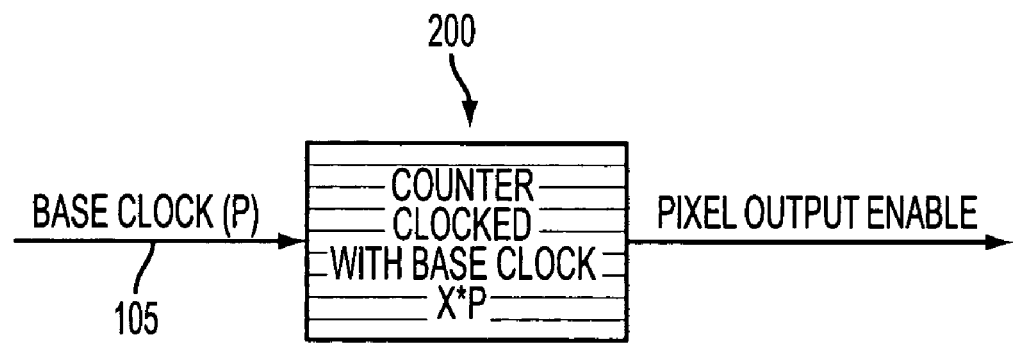
FIG. 2 illustrates an exemplary diagram of a whole delay circuit in accordance with another embodiment.

FIG. 2 illustrates a diagram of the whole delay circuit 200 in accordance with another embodiment. It should be readily apparent to those of ordinary skill in the art that the circuit 200 depicted in FIG. 2 represents a generalized schematic illustration and that other components may be added or existing components may be removed or modified.

As shown in FIG. 2, the whole delay circuit 200 may have the base clock signal 105 as input and output pixel output enable after predetermined amount of delay. The amount of delay may be determined according to X*P, where X is number of whole units of delay and P is the pixel clock rate. The value of X may be predetermined or set by the requirements of an overall system.

The whole delay circuit 200 may be implemented using a counter. Counters are well known to those skilled in the art. The use of counters to generate whole units of delay may be preferable because they use less logic resources to implement (versus combinatorial logic gates) and the ease of place and route is achieved when using the base clock 105 since it is the slowest frequency clock.

Figure 3:
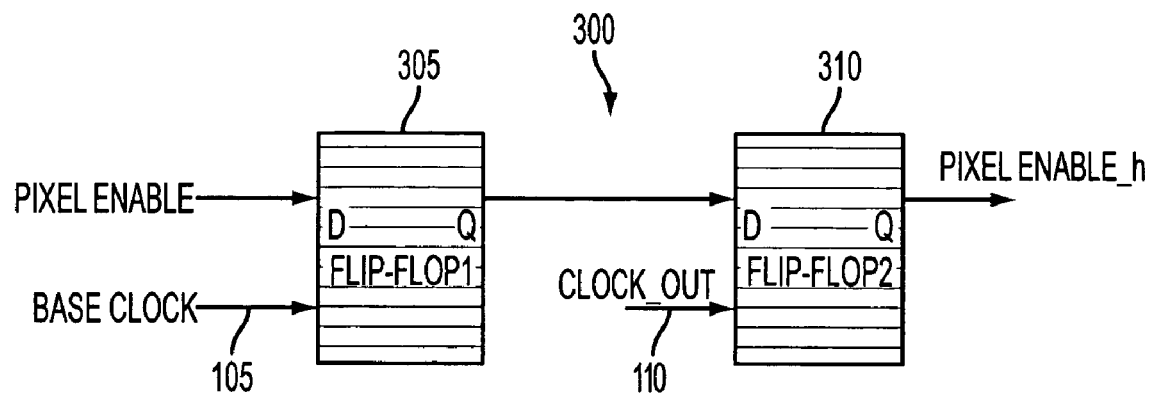
FIG. 3 illustrates an exemplary diagram of a half delay circuit, in accordance with yet another embodiment of the invention.

FIG. 3 illustrates a diagram of the half delay circuit 300 in accordance with another embodiment. It should be readily apparent to those of ordinary skill in the art that the circuit 300 depicted in FIG. 3 represents a generalized schematic illustration and that other components may be added or existing components may be removed or modified.

As shown in FIG. 3, the half delay circuit 300 may be configured to generate half units of delay. More particularly, flip-flops are used at different clock domains to generate the half units of delay. The use of flip-flops without any combinatorial circuits in between may allow the highest possible performances, especially when floorplanning is exercised in the design flow. The half delay circuit 300 may include a first flip-flop 305 and a second flip flop 310.

The first flop-flop 305 may be connected to the pixel enable at the D-input. The base clock signal may be inputted as the clock signal for flip-flop 305. The output of the flip-flop 305 may be connected to the input of the flip-flop 310. The clock out signal 110 may be connected to the clock input of flip-flop 310. The output of the flip-flop 310 is the half delay pixel enable signal (labeled as Pixel_Enable_h). Since the clock out signal 110 is twice the frequency of the base clock 105, the output "Pixel_Enable_h" are always at the half clock boundary, which corresponds to the half pixel boundary.

Figure 4:
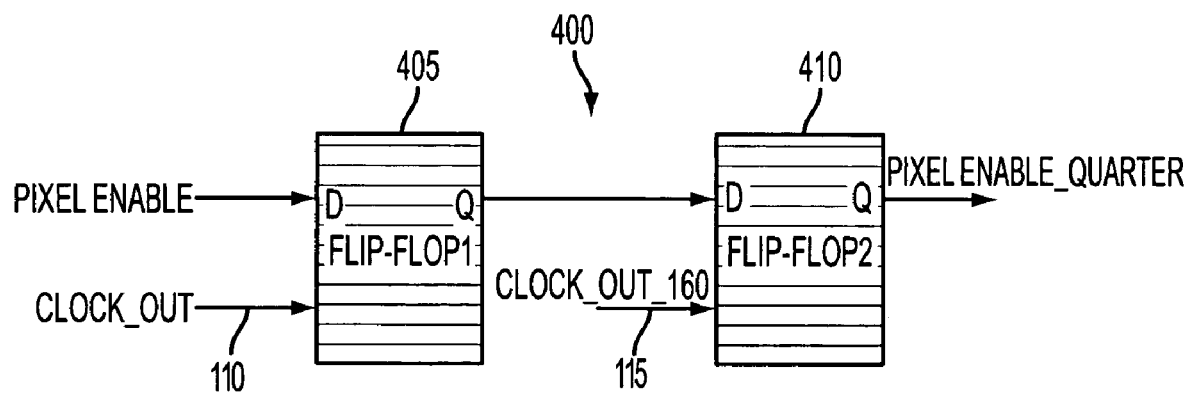
FIG. 4 illustrates an exemplary diagram of a half delay circuit, in accordance with yet another embodiment of the invention.

FIG. 4 illustrates a diagram of the quarter delay circuit 400 in accordance with another embodiment. It should be readily apparent to those of ordinary skill in the art that the circuit 400 depicted in FIG. 4 represents a generalized schematic illustration and that other components may be added or existing components may be removed or modified.

As shown in FIG. 4, the quarter delay circuit 400 may be configured to generate quarter units of delay. More particularly, flip-flops are again used at different clock domains to generate the quarter units of delay. The quarter delay circuit 400 may include a first flip-flop 405 and a second flip flop 410.

The first flop-flop 405 may be connected to the pixel enable at the D-input. The clock out signal 105 may be inputted as the clock signal for flip-flop 405. The output of the flip-flop 405 may be connected to the input of the flip-flop 410. The inverted clock out signal 115 may be connected to the clock input of flip-flop 410. The output of the flip-flop 410 is the quarter delay pixel enable signal (labeled as Pixel_Enable_quarter). Since the clock out signal 110 is twice the frequency of the base clock 105, and the inverted clock out signal 115 is the negative version of the clock out signal 110, there is always a 0.25 units of delay separation between flip-flops that are clocked between clock out signal 110 and the inverted clock signal 115.

Figure 5:
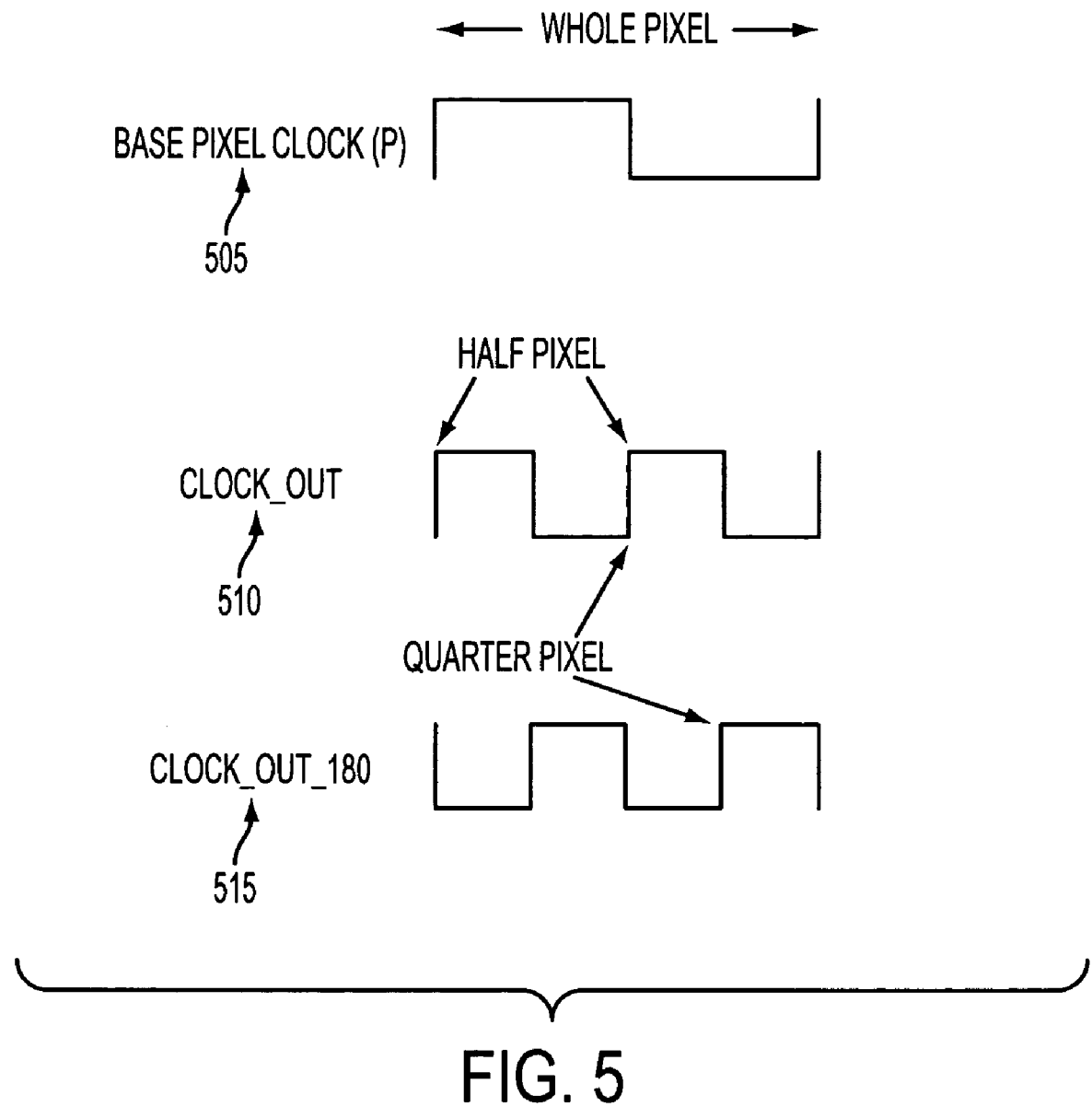
FIG. 5 depicts the timing diagram for pixel delays.

FIG. 5 depicts the relationships between clock and pixel separation. As shown in FIG. 5, any rising edge of the base clock 505 to the next rising-edge of the base clock 505 may constitute one pixel delay. Similarly, any rising edge of the clock out 510 to the next rising-edge of the clock_out 510 may constitute a half pixel delay. Any rising-edge of the clock_out 510 to the rising-edge of the clock_out_180 515 may constitute a quarter pixel delay. These conditions are true since clock_out 510 and clock_out_180 515 are derived from the base clock, and therefore are synchronous to the base clock 505.

Figure 8:
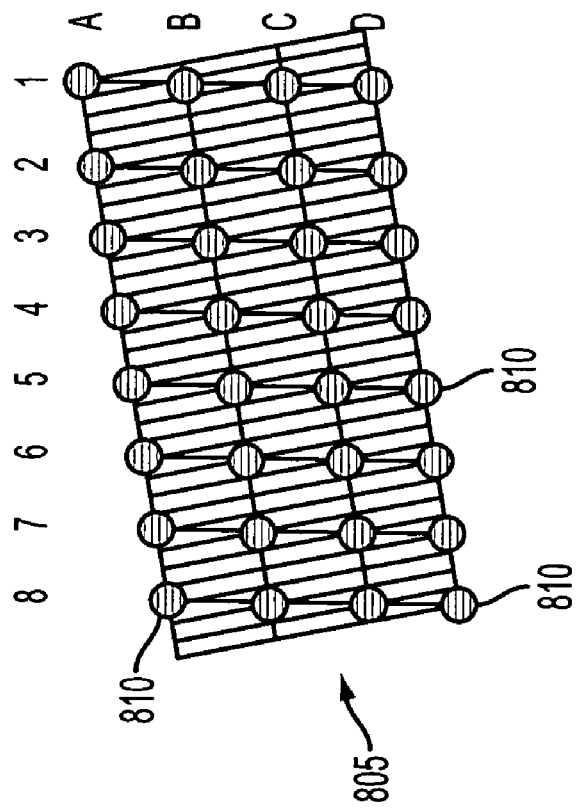
FIG. 8 illustrates a conventional VCSEL array and related timing.

As an illustrative example, returning to FIG. 8, the VCSEL array 805 includes a pixel C5 that requires a correction in the fastscan (X) direction. Assume the initial condition of the pixel clock rate "P" and a desired pixel placement accuracy of 1/(P×N), where P is the base pixel clock of 100 MHz and N may be four or 2.5 ns increment.

In this example, assume the displacement from pixel A1 to A2 is 33.36471 and the displacement from pixel A1 to B1 is 1.614 pixels. Thus, the total displacement to pixel C5 is 136.68684 pixels ((4*33.36471) +(2*1.614)). Since the resolution is 2.5 ns, the total displacement may be rounded to the nearest quarter pixel, which is 136.75. Therefore 136 whole pixel delays in addition to a 0.75 delay in the fast scan direction may be needed to order to be vertically aligned with pixel A1.

Figure 6:
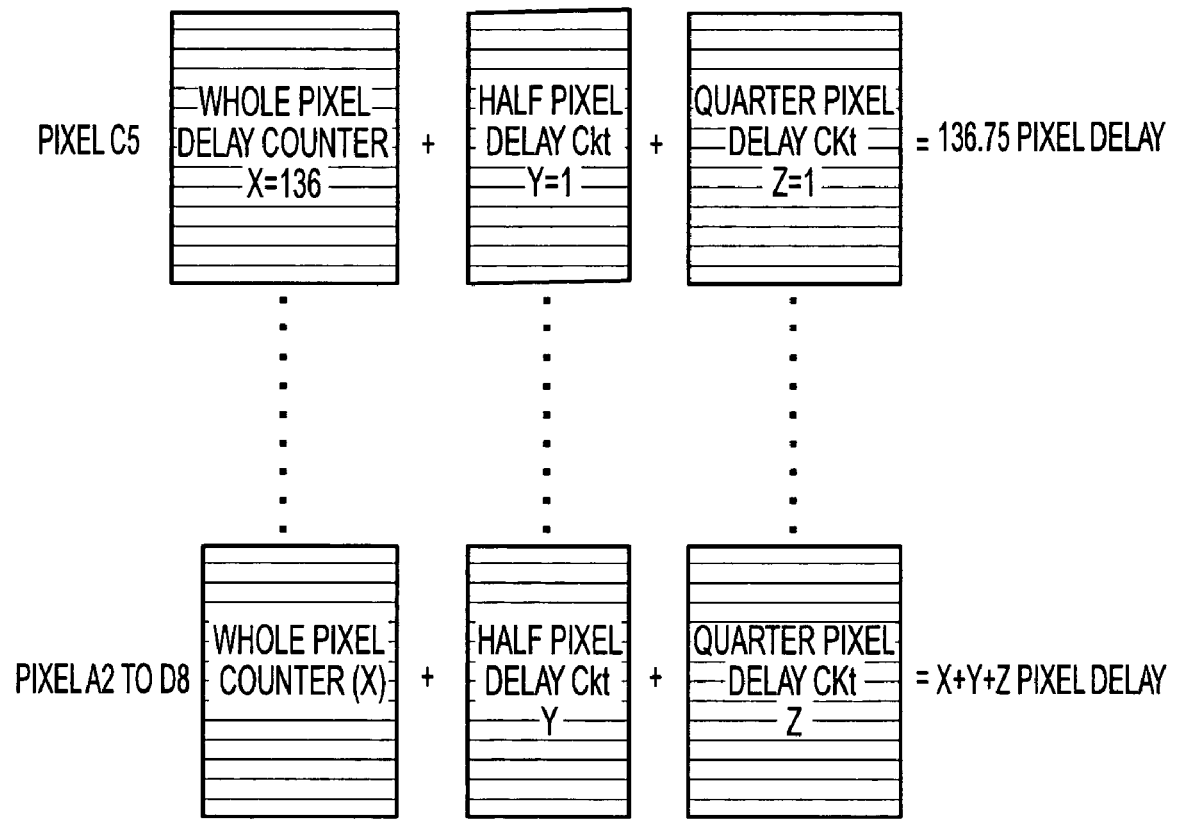
FIG. 6 illustrates a high level diagram of the delays.

Accordingly, as shown in FIG. 6, the 136.75 pixel delay may be implemented using the whole delay circuit set for 136 units of delay (i.e., X=136), a half delay circuit (0.5) and the quarter delay circuit (0.25). Similarly, the delays for pixels A2 to D8 (see FIG. 8) may be implemented using combinations of the whole delay, half delay, and quarter delay circuits.

Figure 7:
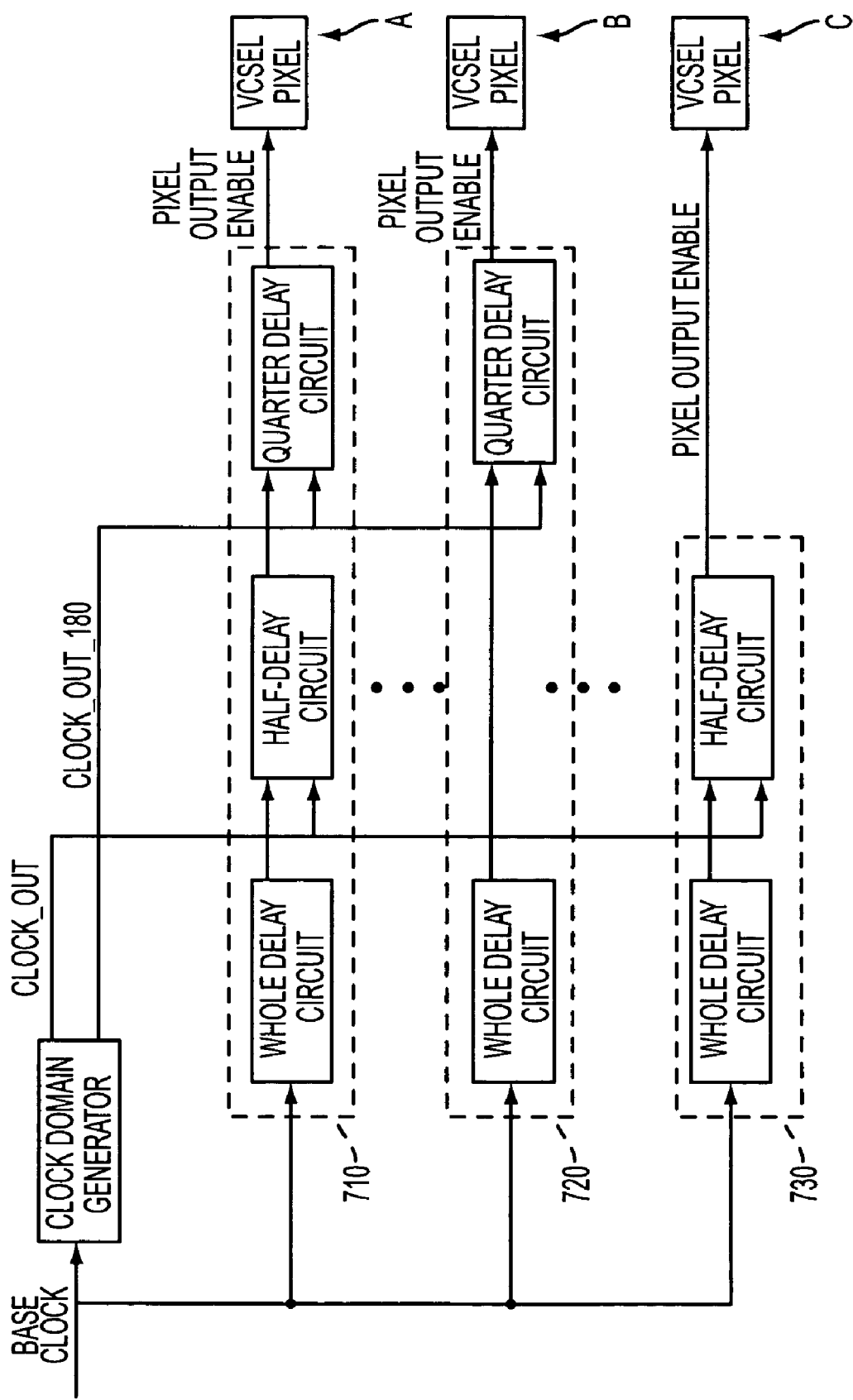
FIG. 7 illustrates a block diagram of yet another embodiment.

FIG. 7 illustrates an exemplary system 700 for yet another embodiment. It should be readily apparent to those of ordinary skill in the art that the circuit 700 depicted in FIG. 7 represents a generalized schematic illustration and that other components may be added or existing components may be removed or modified.

As shown in FIG. 7, the system 700 includes a clock domain generator 100, whole delay circuits 200, half delay circuit 300, and quarter delay circuits 400. The total delay circuit 710 for VCSEL pixel A may include a whole delay circuit, a half delay circuit, and a quarter delay circuit. The total delay circuit 710 may be used for pixels that have ¾ pixel delays. For example, if the VCSEL pixel A had a delay of the 120.75, circuit 710 would be used with X (for the whole delay circuit) set to 120. Similarly, for pixels that have ¼ pixel delays, circuit 720 may be used. As an example, if VCSEL pixel B had a delay of 100.25, circuit 720 may be used with X set to 100. For pixels that have ½ pixel delays, circuit 730 may be used where X may be set for the whole pixel delay for the selected pixel.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the method has been described by examples, the steps of the method may be performed in a different order than illustrated or simultaneously. Those skilled in the art will recognize that these and other variations are possible within the spirit and scope as defined in the following claims and their equivalents.

What is claimed is:

1. A method of delaying based on a single clock signal, the method comprising:
providing a first clock signal;
generating a second clock signal on the first clock signal and a third clock signal that is the inverse of the second clock signal;
generating a unit of delay based the first clock signal; and
generating a half unit of delay based on the first and second clock signal, wherein the first clock signal is a base clock signal and the second clock signal is a clock out signal that is twice the frequency of the base clock.

2. The method of claim 1, further comprising generating a quarter unit of delay based on the first, second and third clock signals.

3. The method of claim 1, further comprising:
determining a number of quarter-units of delay; and
generating a pixel enable signal based on the number of quarter-units of delay, the second clock signal and the third clock signal, wherein the pixel enable signal is active after the number of quarter-units of delay.

4. The method of claim 1, further comprising:
determining a number of units of delay; and
generating a pixel enable signal based on the number of units of delay and the first clock signal, wherein the pixel enable signal is active after the number of units of delay.

5. The method of claim 1, further comprising:
determining a number of half-units of delay; and
generating a pixel enable signal based on the number of half-units of delay, the first clock signal and the second clock signal, wherein the pixel enable signal is active after the number of half-units of delay.

6. An apparatus for generating pixel delays, the apparatus comprising:
an oscillator circuit configured to generate a first clock signal;
a clock domain generator circuit configured to receive the first clock signal and generate a second clock signal and a third clock signal, wherein the second clock signal is a multiple of the first clock signal and the third clock signal is the inverse of the second clock signal;
a whole delay circuit configured to generate units of delay, wherein the whole delay circuit is configured to interface with the first clock signal;
a half delay circuit configured to generate half-units of delay, wherein the half-delay circuit is configured to interface with the first clock signal and the second clock signal; and a quarter delay circuit configured to generate half-units of delay, wherein the quarter delay circuit is configured to interface with the second clock signal and the third clock signal.

7. The apparatus of claim 6, wherein the whole delay circuit comprises a counter clock configured to a immber of units of delay and to receive the first clock signal as an input.

8. The apparatus of claim 7, wherein the counter clock is further configured to generate a pixel enable signal based on the product of the number of units of delay and the frequency of the first clock signal.

9. The apparatus of claim 6, wherein the half delay circuit comprises:
   a first flip-flop configured to receive a pixel enable signal and the first clock signal; and
   a second flip-flop configured to receive an output from the first flip-flop and the second clock signal, wherein the half delay circuit is configured to pass the pixel enable signal after a half unit of delay.

10. The apparatus of claim 6, wherein the quarter delay circuit comprises:
    a first flip-flop configured to receive a pixel enable signal and the second clock signal; and
    a second flip-flop configured to receive an output from the first flip-flop and the third clock signal, wherein the quarter delay circuit is configured to pass the pixel enable signal after a quarter unit of delay.

11. The apparatus of claim 6, wherein the clock domain generator further comprises one of a clock manager, a delay-locked loop and a phased-locked loop.

12. The apparatus of claim 11, wherein the clock domain generator is configured to receive the first clock signal and to generate a multiple of the first clock signal as the second clock signal.

13. A method of delay generation, the method comprising:

providing a first clock signal;

generating a second clock signal based on the first clock signal and a third clock signal that is the inverse of the second clock signal;

determining an amount of delay;

restructuring the amount of delay into whole units of delay, half units of delay, and quarter units of delay; and generating the amount of delay based on the first clock signal, the second clock signal and the third clock signal, wherein the first clock signal is a base clock signal and the second clock signal is a clock out signal that is twice the frequency of the base clock.

14. The method of claim 13, further comprising generating the whole units of delay based on the first clock signal.

15. The method of claim 13, further comprising generating a half unit of delay based on the first and second clock signals.

16. The method of claim 13, further comprising generating a quarter unit of delay based on the second and third clock signals.

* * * * *